United States Patent [19]

Shiffer, II

[11] Patent Number: 5,287,321
[45] Date of Patent: Feb. 15, 1994

[54] ILLEGAL ADDRESS DETECTOR FOR SEMICONDUCTOR MEMORIES

[75] Inventor: James D. Shiffer, II, Fremont, Calif.

[73] Assignee: VLSI Technology, Inc., San Jose, Calif.

[21] Appl. No.: 825,489

[22] Filed: Jan. 24, 1992

[51] Int. Cl.⁵ .............................................. G11C 13/00
[52] U.S. Cl. ........................... 365/230.01; 365/189.07; 365/207
[58] Field of Search ...................... 365/230.01, 189.01, 365/230.04, 230.08, 189.07, 230.02, 207

[56] References Cited

U.S. PATENT DOCUMENTS

4,675,808  6/1987  Grinn et al. ...................... 365/230.02
5,121,354  6/1992  Mandalia ......................... 365/230.03

Primary Examiner—Terrell W. Fears

[57] ABSTRACT

When a user requests a RAM or other semiconductor memory to be compiled with a number of rows that is not a power of two, the compiler creates the RAM with one extra row. The rows requested by the user are placed at contiguous row addresses starting at zero and ending at one less than the number of rows requested. The highest of these row addresses is placed permanently in a comparator by the compiler. The comparator then compares each row address input to the RAM to the row address contained in the comparator. If the row address input is higher, then the comparator selects the extra row. The extra row can be written into or read from in the same manner as any other row in the RAM. The delay of the comparator is comparable to the delay of the address decoder, so that the RAM operates within the same specifications regardless of whether the address decoder selects a row or the comparator selects the extra row.

10 Claims, 4 Drawing Sheets

ILLEGAL ADDRESS DETECTOR FOR SEMICONDUCTOR MEMORIES

BACKGROUND OF INVENTION

1. Field of Invention

The present invention relates to an illegal address detector for semiconductor memories, and more particularly to an illegal address detector for semiconductor memories having word depths that are not a power of two.

2. State of the Art

Semiconductor memories have conventionally been designed to include a number of memory words that is a power of two, since an address input having n address lines maybe used to uniquely address $2^n$ memory words. In custom integrated circuit design where user requirements are well-known, it is not uncommon for a particular application to require a number of memory words greater than a power of two but considerably less than a next power of two. In such an instance, space savings may be realized by designing the memory to have only the number of memory words required such that space that would have otherwise been used for additional memory words to reach the next power of two may be devoted to other purposes. Custom design of semiconductor memories may be readily performed using computer-aided design tools known as memory compilers.

When a semiconductor memory is designed to have a number of memory words that is not a power of two, provision must be made for the user's inadvertently addressing memory locations that do not exist in the memory. Otherwise, the output of the memory will be unpredictable, and in the extreme case, damage to the semiconductor memory may even result. In memories using precharged bit lines, for example, if a word that does not exist in the memory is addressed, the bits lines both remain high, and may float from their precharged high state to unpredictable values. Even if the semiconductor memory remains unharmed, higher power consumption nevertheless results.

One possible solution to this problem would be to add a circuit that would sense the floating bit lines and pull one of them low. Such a circuit incurs a speed penalty, however, in that it slows down the normal operation of the memory. Time must be allowed for one of the bit lines to go low before the circuit can begin to sense that this has not happened and that one of the bit lines must be pulled low. If the memory is being operated at top speed, such a circuit, although it may solve the problem of higher power consumption, is unable to solve the problem of unpredictable outputs from the memory.

What is needed then, is a simple, easily compiled circuit that may be included in semiconductor memories having a word depth not equal to a power of two to make the memory outputs predictable, and to make the memory operate within the same specifications (power, speed, etc.) no matter what address is applied.

SUMMARY OF THE INVENTION

According to the present invention, a memory device includes N+1 memory rows where N is not a power of two and a group of address input terminals for receiving a memory row address. A decoder circuit causes a unique memory row to be addressed for each memory row address having a value not greater than N−1, and an illegal address detector circuit causes a common memory row to be addressed for all memory row addresses having a value greater than or equal to N. More particularly, when a user requests a RAM or other semiconductor memory to be compiled with a number of words that is not a power of two, the compiler creates the RAM with one extra row. The words requested by the user are placed at contiguous row addresses starting at zero and ending at one less than the number of rows requested. The highest of these row addresses is placed permanently in a comparator by the compiler. The comparator then compares each row address input to the RAM to the address contained in the comparator. If the row address input is higher, then the comparator selects the extra row. The extra row can be written into or read from in the same manner as any other row in the RAM. The delay of the comparator is comparable to the delay of the row address decoder, so that the RAM operates within the same specifications regardless of whether the address decoder selects a row or the comparator selects the extra row.

DETAILED DESCRIPTION OF THE PREFERRED EMBODIMENTS

Figure 1:
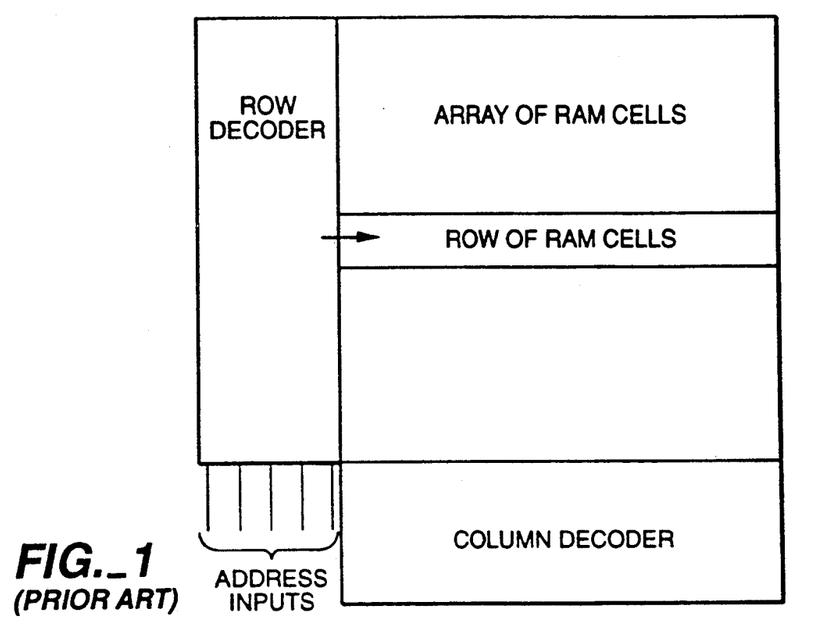
FIG. 1 is a floor plan of a RAM according to the prior art.
Figure 2:
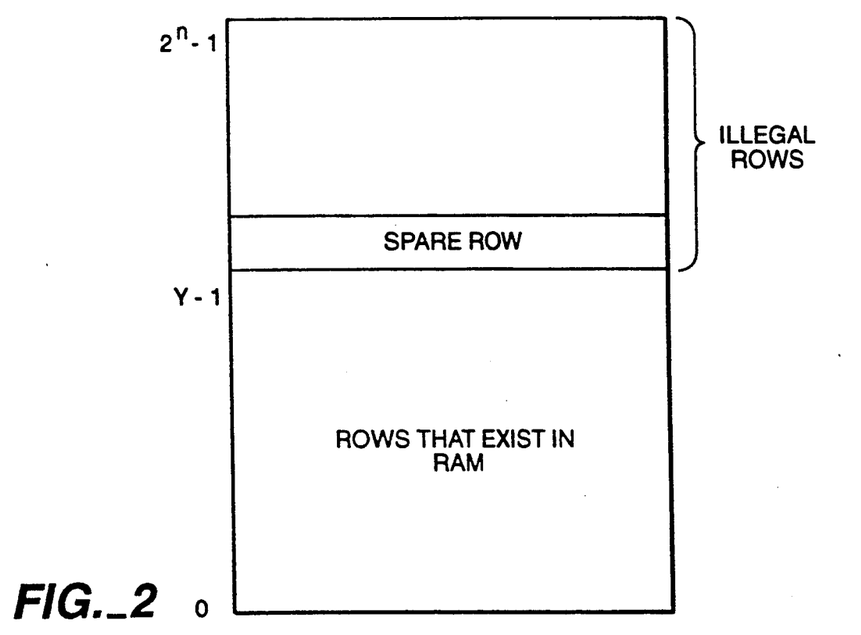
FIG. 2 is a memory map of a RAM having a number of words that is not a power of two according to the present invention.

Referring to FIG. 1, in a typical RAM, a square or rectangular array of RAM cells is bordered on one edge by a row decoder and on an adjacent edge by a column decoder. The memory address is divided into a row address portion and a column address portion, each of which is input to the corresponding decoder. The row decoder is responsive to the row address inputs to select a particular row of RAM cells, and the column decoder is responsive to the column address inputs to select a particular word within that particular row. A preferred embodiment of the present invention assumes that all of the rows of RAM cells are completely filled, i.e., that there are no partial rows. Accordingly, only the row address inputs need be examined for purposes of detecting an illegal address. In other words, if the row address is legal, then the column address is necessarily legal such that the entire address combined must refer to a word that exists in RAM.

If the row address of the RAM has a total of n bits, then an address space defined thereby contains a total of $2^n$ rows, numbered from zero to $2^n - 1$. When a RAM is created having a number of rows that is not a power of two, then a portion of the address space defined by the number of row address bits remains unused. The words of the rows that would otherwise have been addressed by row addresses within the unused portion of the address space therefore contain illegal words in that they do not actually exist in RAM.

For purposes of the present invention, rows that do exist in RAM are assigned row addresses in the bottom portion of the address space beginning with zero and proceeding sequentially up to $Y-1$, where Y represents the number of rows required to be in the RAM. Row addresses in the remaining upper portion of the address space from row address Y to row address $2^n-1$ therefore define illegal rows. In accordance with the preferred embodiment of the present invention, one illegal row, or spare row, is added to the number of rows required to exist in RAM and in effect takes the place of all of the illegal rows in that any and all illegal addresses cause the spare row to be addressed. Physically, the spare row is realized in the same manner as the rest of the rows in RAM and therefore behaves as a normal row. The words in the spare row can be both written to and read from.

Figure 3:
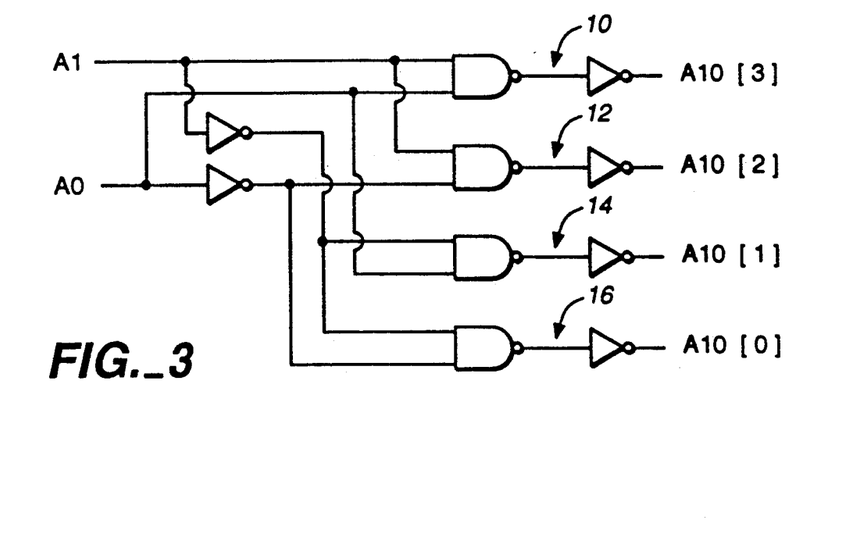
FIG. 3 is a schematic diagram of a two-bit predecoder.

In the preferred embodiment of the present invention, in order to detect illegal addresses, pairs of adjacent row address bits are first predecoded using a two-bit predecoder of a kind illustrated in FIG. 3. Two adjacent address bits A0 and A1, for example, are made available in their true and inverted forms to four AND gates, realized by the series combination of a NAND gate and an inverter. Each AND gate detects one of the 4 possible values of the 2-bit combination. A first AND gate 10 detects when the two-bits represent a binary three and produces an output designated A10[3], representing that the two address bits A1 and A0 together have a binary value of three or 11. The first AND gate is therefore connected to the true forms of both address bit A0 and address bit A1. The second AND gate 12 detects a binary two and is connected to the true form of address bit A1 and the inverted form of address bit A0, and so forth for the remaining gates 14 and 16.

Figure 4:
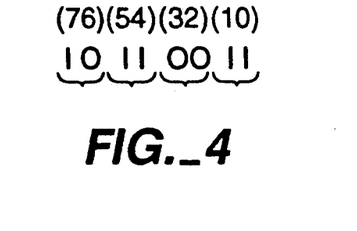
FIG. 4 is an example, used in the explanation of FIG. 5, of a highest legal memory row address.

For a memory having an 8-bit row address, the maximum legal row address might be for example 10110011 as shown in FIG. 4. The illegal address detector of the present invention considers the address bits in pairs as indicated by the brackets in FIG. 4, each address bit pair being input to a two-bit predecoder such as that of FIG. 3. Address bits 7 and 6 are therefore paired, as are address bits 5 and 4, address bits 3 and 2 and address bits 1 and 0.

Figure 5:
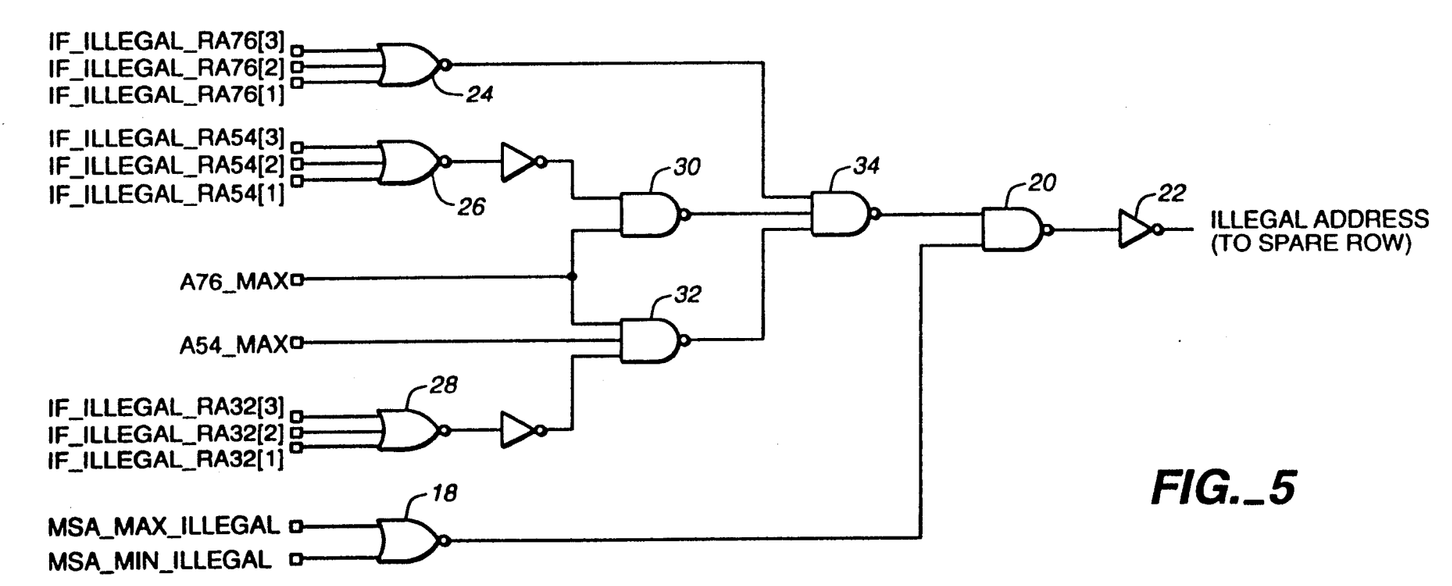
FIG. 5 is a schematic diagram of an embodiment of the illegal address detector of the present invention.

Referring now to FIG. 5, the comparison circuit of the illegal address detector of the present invention takes the form of a collection of interconnected NAND gates, NOR gates and inverters, together with a single OR gate.

An important feature of the comparison circuit of the present invention is that the number being compared to, e.g. the maximum legal row address, is implicitly and permanently programmed into the comparison circuit without having to be provided thereto as a separate input. This programming is accomplished with respect to each predecoded output signal of each row address bit pair by connecting that output signal to an appropriate one of the NOR gates only if that output signal presents a possible illegal address. In the example of FIG. 4, since there are four address bit pairs, each address bit pair being predecoded to provide four output signals, one would expect to find in FIG. 5 four four-input NOR gates. Since a predecoded output signal of zero can never specify an illegal address, however, the input for the zero predecoded output signal has been eliminated. In other words, each address bit pair has a binary value that may not be exceeded without indicating the possible occurrence of an illegal address. That binary value must be at least zero, which can never be exceeded. Therefore the zero input is eliminated.

Furthermore, according to the particular embodiment of FIG. 5, the number of rows in the memory is required to be a multiple of four such that the least significant row address bit pair (10) will always have a binary value of three and hence need not be compared in the comparison circuit. Accordingly, instead of four four-input NOR gates, three three-input NOR gates are provided in FIG. 5.

In order to insure the fastest possible comparison, comparisons performed on the most significant predecoded outputs are arranged so as to immediately determine the output of the comparison circuit whenever those output signals contain sufficient information. Otherwise, further comparisons performed on the predecoded output signals of lesser significance are used to determine the output of the comparison circuit.

Therefore, at the highest level, the recognition is made that an illegal address will always occur in the upper half of the address space. Thus for the most significant row address bit pair, the value 01 will always define a legal address, whereas the values 10 and 11 may or may not define legal addresses. In the example of FIG. 4, the maximum illegal value of the most significant row address bit pair is 11. The predecoder output ra76[3], indicating that the row address bits 7 and 6 together represent a binary three, is therefore connected to the msa_max_illegal input of the OR gate 18. The minimum illegal value of the most significant row address bit pair is 11, since a row address beginning with 10 could be illegal depending on the row address bit pair (32). The predecoded output signal ra76[2] is therefore connected to the msa_min_ illegal input of the OR gate 18. As a result, unless the most significant row address bit pair is either 11 or 10, the OR gate 18 produces a low signal which forces the NAND gate 20 to produce a high signal. The high signal is input to an inverter/driver 22. The inverter 22 produces a low signal indicating that the address is not illegal. When the most significant address bit pair is 11 or 10, the OR gate 18 produces a high output signal, and the NAND gate 20 is dependant on comparison results from one or more of the NOR gates 24, 26 and 28 to produce a final output signal.

A similar approach is followed with respect to the NOR gates to enable the comparison to proceed more quickly. The maximum legal address of the most significant address bit pair is input to a NAND gate 30 that receives the output signal of the NOR gate 26 connected to the (54) predecoder. If the most significant address bit pair is exactly equal to the maximum legal value for the most significant address bit pair, then comparison results from the NOR gate 26 connected to the (54) predecoder are needed and are allowed to influence the output of the NAND gate 30. Otherwise, comparison results may be obtained based on the most significant address bit pair alone, and the output of the NAND gate 30 is forced high. Similarly, the maximum legal values of the (76) address bit pair and the maximum legal value of the (54) address bit pair are both input to a NAND gate 32 that receives the output signal of the NOR gate 28 connected to the (32) predecoder. If both the (76) address bit pair and the (54) address bit pair are exactly equal to the maximum legal values thereof, then the output of the NAND gate 32 is caused to be dependent on the output signal of the NOR gate 28. Otherwise, the output of the NAND gate 32 is forced to a high level.

As previously explained, each input of the NOR gates 24, 26 and 28 associated with the respective predecoded output signals for the respective address bit pairs is connected to that predecoded output signal only if it defines a possible illegal address. In the example of FIG. 4, the most significant address bit pair of the maximum legal address is 10. For that address bit pair, only the value 11 is illegal. Accordingly, the input if_illegal_ra76[3] of the NOR gate is connected to its corresponding predecoder output, and the other two inputs to the NOR gate 24 are grounded. For the next address bit pair (54), none of the predecoder output signals define possible illegal addresses, such that all of the inputs to the NOR gate 26 are grounded. And in the case of the next significant address bit pair (32), all of the relevant predecoder output signals define possible illegal addresses such that all of the input signals to the NOR gate 28 are connected to their respective predecoder outputs. The foregoing connections are illustrated in FIG. 6.

Figure 6:
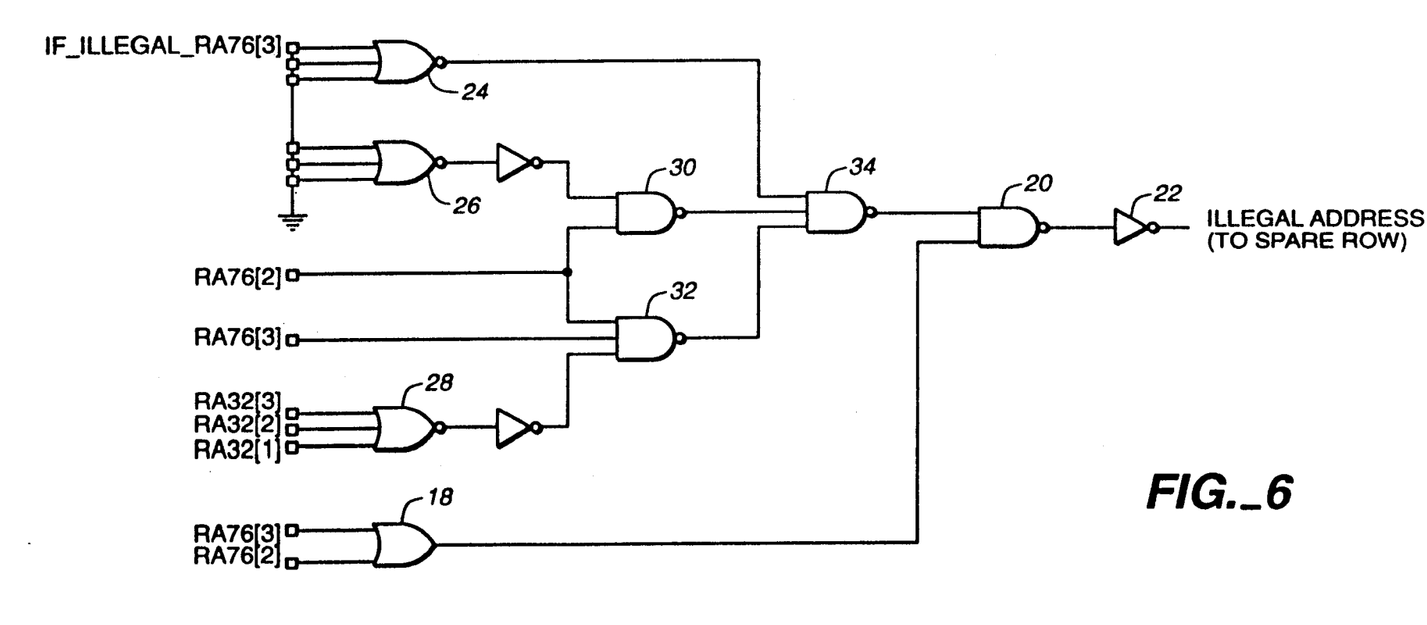
FIG. 6 is a schematic diagram of the illegal address detector of FIG. 5 connected according to the example of FIG. 4.

Operation of the comparison circuit of FIG. 6 may be better understood with reference to several concrete examples of specific legal and illegal row addresses. Assume for example that the row address applied to the memory is the maximum legal row address of FIG. 4, namely 10110011. The input ra76[3] to the NOR gate 24 would then be 0, the input ra76[2] to the NAND gates 30 and 32 would be 1, and the input ra54[3] to the NAND gate 32 would be 1. The inputs ra32 to the NOR gate 28 would all be 0, the input 76[3] to the OR gate 18 would be 0 and the input 76[2] to the OR gate 18 would be 1. The output of the OR gate 18 would therefore be 1. The inputs to each of the NAND gates 30 and 32 that when 0 force the outputs of the NAND gates to 1 are instead all 1s. Accordingly, the value of all three inputs to the NAND gate 34 and the value of the output thereof must be determined to determine the final output of the comparison circuit. The output of the first NOR gate 24 is a 1, the output of the second NOR gate is also a 1 which is inverted to a 0, causing the NAND gate 30 to produce a 1 input to the NAND gate 34, and the output of the third NOR gate 28 is 1, which is inverted to a 0 causing the NAND gate 32 to output a 1 to the NAND gate 34. All three inputs to the NAND gate 34 are therefore 1, such that the NAND gate 34 produces a 0 output which causes the final NAND gate 20 to produce a 1 which is then inverted to a 0, indicating a legal address.

Assume instead that the row address applied to the memory is 10110110 (illegal). From the foregoing example it is already known that the output of the second NOR gate 26 will always be a 1, which is then inverted to a 0 and input to the NAND gate 30. In this example, the input signals ra76[3] and ra76[2] are the same as before such that the output of the OR gate 18 will again be a 1, the output of the first NOR gate 24 will again be a 1 and the output of the NAND gate 30 will again be a 1. The input signal 54[3] is also a 1 as before. Now however, of the ra32 inputs, ra32[2] is a 1 instead of a 0. The output of the third NOR gate 28 therefore becomes a 0 and is inverted to a 1 such that the NAND gate 32 produces a 0, the NAND gate 34 produces a 1, and the final NAND gate 20 produces a 0 which is then inverted by the inverter 22 to apply a high drive signal to the row line of the spare row.

Assume instead that the row address input to the memory is 11000101 (illegal). The input signals ra76[3] and ra76[2] both change to the opposite value but the output of the OR gate 18 remains unchanged. The inputs ra76[2] and ra54[3], however, are both 0 such that the output of the NAND gates 30 and 32 are both forced to 1, the output of the circuit depending on the output of the first NOR gate 24. Since ra76[3] is a 1, the output of the NOR gate 24 is a 0 such that the output of the NAND gate 34 is a 1, the output of the final NAND gate 20 is a 0 and the spare row line is driven by the inverter 22.

Finally, assume that the row address input to the memory is 01110011 (legal). The input signals ra76[3] and ra76[2] are therefore both 0, the output of the OR gate 18 is 0 and the output of the final NAND gate 20 is forced to a 1 which is then inverted to a 0 indicating a legal address.

With minor modifications, the same circuit concept may be used without predecoded inputs and for addresses not having an even number of bits. It is also not essential that all of the rows of RAM cells be completely filled. If partial rows are allowed, then the column address bits may be examined in addition to the row address inputs for purposes of detecting an illegal address. Instead of providing an extra row as described above, a single extra word may be provided to the same effect. Furthermore, although the present invention is expected to find widest application to RAMs, it may also be applied to other types of semiconductor memories. For example, a partially decoded ROM, in accordance with the teachings of the present invention, may be provided with an extra word that is read out if none of the other words are addressed.

It will be apparent to those of ordinary skill in the art that the present invention may be embodied in other specific forms without departing from the spirit or essential character thereof. The disclosed embodiments are therefore intended in all respects to be illustrative and not restrictive. This scope of the invention is indicated by the appended claims rather than the foregoing description, and all changes which come within the meaning and range of equivalence thereof are intended to be embraced therein.

What is claimed is:

1. A memory apparatus comprising:
N+1 memory rows where N is not a power of two;
means for receiving a memory row address;
decoder means for causing a unique memory row to be addressed for each memory row address having a value not greater than N−1; and
illegal address detector means for causing a common memory row to be addressed for all memory row addresses having a value greater than or equal to N.

2. The memory apparatus of claim 1 wherein said decoder means comprises a row decoder.

3. The memory apparatus of claim 1 wherein said illegal address detector means has an number of inputs fewer than 2M where $2^M$ is the next power of two after N.

4. The memory apparatus of claim 3 wherein said illegal address detector means has exactly M inputs.

5. The memory apparatus of claim 4 wherein said illegal address detector means comprises predecoder means for decoding pairs of address bits of said memory row address and comparator means responsive to said predecoder means for comparing said memory row address with a maximum legal row address having a value of N−1 and implicitly programmed into said comparator means by selectively connecting inputs of said comparator means to one of ground and an output of said predecoder means.

6. The apparatus of claim 5 wherein said predecoder means comprises a two-bit predecoder for each pair of address bits of said memory row address.

7. The memory apparatus of claim 6 wherein said comparator means comprises logic gates including an output gate and a plurality of other gates of different orders in terms of the number of subsequent gates an output signal of a given gate must pass through to reach said output gate, wherein outputs of a predecoder of a most significant pair of address bits of said memory row address are connected to a lesser-order gate than outputs of a predecoder for a next significant pair of address bits of said memory row address.

8. The memory apparatus of claim 7 further comprising a gate responsive to said predecoder for a most significant pair of address bits of said memory row address to produce an output signal that disables said output gate when said memory row address falls within a block of legal memory addresses.

9. A method of comparing a memory address to a maximum legal memory address, comprising the steps of:
   predecoding pairs of address bits of said memory address to produce for each pair of address bits output signals corresponding to binary values of said pair of address bits; and
   for each output signal for each pair of address bits, connecting said output signal to a comparison circuit only if a binary value corresponding to said output signal is greater than a binary value of said pair of address bits when said memory address is said maximum legal memory address.

10. A method of implicitly and nonvolatily programming a first binary number that is a constant into a comparison circuit for comparing two binary numbers to indicate whether a second binary number is greater than said first binary number, comprising the steps of:
   receiving signals representing bits of said second binary number; and
   for each bit of said second binary number, connecting a signal representing said bit to said Comparison circuit only if said bit is greater than a corresponding bit of said first binary number.

* * * * *

UNITED STATES PATENT AND TRADEMARK OFFICE
CERTIFICATE OF CORRECTION

PATENT NO. : 5,287,321

DATED : February 15, 1994

INVENTOR(S) : Shiffer, J.

Page 1 of 4

It is certified that error appears in the above-indentified patent and that said Letters Patent is hereby corrected as shown below:

The title page, showing an illustrative figure, should be deleted and substitute therefor the attached title page.

Delete Drawing sheet(s), consisting of Figs. 5 & 6, and subtitute therefor the drawing sheets, consisting of figs 5 & 6, as shown on the attached pages.

Signed and Sealed this

Eighteenth Day of October, 1994

Attest:

BRUCE LEHMAN

*Attesting Officer*   *Commissioner of Patents and Trademarks*

United States Patent [19]
Shiffer, II

[11] Patent Number: 5,287,321
[45] Date of Patent: Feb. 15, 1994

[54] ILLEGAL ADDRESS DETECTOR FOR SEMICONDUCTOR MEMORIES

[75] Inventor: James D. Shiffer, II, Fremont, Calif.

[73] Assignee: VLSI Technology, Inc., San Jose, Calif.

[21] Appl. No.: 825,489

[22] Filed: Jan. 24, 1992

[51] Int. Cl.⁵ .............................................. G11C 13/00
[52] U.S. Cl. ........................... 365/230.01; 365/189.07; 365/207
[58] Field of Search ...................... 365/230.01, 189.01, 365/230.04, 230.08, 189.07, 230.02, 207

[56] References Cited
U.S. PATENT DOCUMENTS

4,675,808  6/1987  Grinn et al. ..................... 365/230.02
5,121,354  6/1992  Mandalia ......................... 365/230.03

Primary Examiner—Terrell W. Fears

[57] ABSTRACT

When a user requests a RAM or other semiconductor memory to be compiled with a number of rows that is not a power of two, the compiler creates the RAM with one extra row. The rows requested by the user are placed at contiguous row addresses starting at zero and ending at one less than the number of rows requested. The highest of these row addresses is placed permanently in a comparator by the compiler. The comparator then compares each row address input to the RAM to the row address contained in the comparator. If the row address input is higher, then the comparator selects the extra row. The extra row can be written into or read from in the same manner as any other row in the RAM. The delay of the comparator is comparable to the delay of the address decoder, so that the RAM operates within the same specifications regardless of whether the address decoder selects a row or the comparator selects the extra row.

10 Claims, 4 Drawing Sheets

UNITED STATES PATENT AND TRADEMARK OFFICE
CERTIFICATE OF CORRECTION

PATENT NO. : 5,287,321

DATED : February 15, 1994

INVENTOR(S) : Shiffer, J.

Page 3 of 4

It is certified that error appears in the above-indentified patent and that said Letters Patent is hereby corrected as shown below:

In Figure 5, element 18 is an OR gate rather than an NOR gate. Figure 5 should appear as shown below.

UNITED STATES PATENT AND TRADEMARK OFFICE
CERTIFICATE OF CORRECTION

PATENT NO. : 5,287,321
DATED : January 24, 1992
INVENTOR(S) : Shiffer, J.

It is certified that error appears in the above-indentified patent and that said Letters Patent is hereby corrected as shown below:

In Figure 6, the topmost input of element 24 should not be connected to the remaining two inputs. Also in Figure 6, the input of element 32 labeled RA76[3] should instead be labeled RA54[3].

Figure 6 should appear as shown below.